(12) United States Patent
Kato et al.

(10) Patent No.: US 9,354,479 B2
(45) Date of Patent: May 31, 2016

(54) LIQUID-CRYSTAL PANEL AND MANUFACTURING METHOD THEREOF

(71) Applicant: Sharp Kabushiki Kaisha, Osaka (JP)

(72) Inventors: Mutsuto Kato, Osaka (JP); Tomohiro Inoue, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 114 days.

(21) Appl. No.: 14/354,084

(22) PCT Filed: Oct. 19, 2012

(86) PCT No.: PCT/JP2012/006723
§ 371 (c)(1),
(2) Date: Apr. 24, 2014

(87) PCT Pub. No.: WO2013/061556
PCT Pub. Date: May 2, 2013

(65) Prior Publication Data
US 2014/0313450 A1 Oct. 23, 2014

(30) Foreign Application Priority Data
Oct. 27, 2011 (JP) .................................. 2011-235653

(51) Int. Cl.
*G02F 1/1362* (2006.01)
*H01L 27/12* (2006.01)
*H01L 21/66* (2006.01)
*H01L 29/417* (2006.01)
*G02F 1/1343* (2006.01)

(52) U.S. Cl.
CPC ...... *G02F 1/136286* (2013.01); *G02F 1/13624* (2013.01); *H01L 22/14* (2013.01); *H01L 27/124* (2013.01); *H01L 27/1259* (2013.01); *G02F 2001/134345* (2013.01); *G02F 2001/136268* (2013.01); *G02F 2001/136295* (2013.01); *H01L 29/41733* (2013.01); *H01L 2924/0002* (2013.01)

(58) Field of Classification Search
CPC .................... G02F 1/136286; H01L 27/1259
See application file for complete search history.

(56) References Cited

U.S. PATENT DOCUMENTS

| 6,340,998 B1 * | 1/2002 | Kim ................... G02F 1/13624 349/192 |
| 6,839,099 B2 * | 1/2005 | Fukunishi ......... G02F 1/136213 349/192 |

(Continued)

FOREIGN PATENT DOCUMENTS

| JP | 2008-15512 A | 1/2008 | |
| JP | 2008-089646 | * 4/2008 | ................ G09F 9/30 |

*Primary Examiner* — Sang V Nguyen
(74) *Attorney, Agent, or Firm* — Chen Yoshimura LLP

(57) ABSTRACT

A TFT substrate (20) forming a part of a liquid crystal display panel includes: respective pixels having mutually adjacent first sub-pixels and second sub-pixels; first source electrodes (14*aba*) that branch towards the first sub-pixels and form a portion of respective first TFTs (5*a*) after respective source lines (14*a*) between the respective pixels continue along respective gate lines (11*a*) extending between the first sub-pixels and second sub-pixels of the respective pixels; and a second source electrode (14*abb*) that branches towards the second sub-pixel and forms a portion of the respective second TFTs (5*b*). The respective gate lines (11*a*) have openings where the respective source lines (14*a*) have branched.

5 Claims, 8 Drawing Sheets

(56) References Cited

U.S. PATENT DOCUMENTS

| | | | |
|---|---|---|---|
| 2005/0036091 A1* | 2/2005 | Song | G02F 1/133707 349/129 |
| 2007/0064182 A1* | 3/2007 | Lin | G02F 1/13624 349/114 |
| 2008/0018573 A1 | 1/2008 | Hsieh et al. | |
| 2008/0024690 A1* | 1/2008 | Hirakata | G02F 1/136259 349/54 |
| 2009/0295701 A1* | 12/2009 | Matsumoto | H01L 27/124 345/92 |
| 2010/0141849 A1* | 6/2010 | Enda | G02F 1/13624 348/731 |
| 2010/0225831 A1* | 9/2010 | Takeuchi | G02F 1/136213 348/739 |
| 2010/0328290 A1* | 12/2010 | Jeong | G02F 1/133555 345/211 |

\* cited by examiner

LIQUID-CRYSTAL PANEL AND MANUFACTURING METHOD THEREOF

TECHNICAL FIELD

The present invention relates to a liquid crystal display panel and a method of manufacturing the same, and particularly relates to a technology that, in a liquid crystal display panel provided with a thin-film transistor substrate, corrects a short-circuit defect between source electrodes of respective thin-film transistors on the thin-film transistor substrate and a common electrode on an opposite substrate.

BACKGROUND ART

An active matrix driven liquid crystal display panel includes a TFT substrate that has a thin-film transistor (hereinafter, "TFT") and a pixel electrode connected to this TFT for every pixel, a pixel being the smallest unit of an image, and further includes an opposite substrate facing this TFT substrate and having a common electrode, and a liquid crystal layer provided between the respective pixel electrodes on the TFT substrate and the common electrode on the opposite substrate, for example. On many TFT substrates, an auxiliary capacitance is provided for each pixel in order to stabilize the charge of the liquid crystal layer, or namely, the liquid crystal capacitance of the respective pixels.

A liquid crystal display panel is disclosed in Patent Document 1, for example, in which: respective individual pixels (equivalent to the pixel mentioned above) arrayed in a matrix are divided into a plurality of sub-pixel areas; an active element (equivalent to the TFT mentioned above), a liquid crystal capacitor (equivalent to the liquid crystal capacitance mentioned above), and a storage capacitor (equivalent to the auxiliary capacitance mentioned above) are arranged in the respective sub-pixel areas; and the respective capacitance ratios of the storage capacitors to the liquid crystal capacitors of the sub-pixel areas in the same individual pixel are adjusted to differ for each sub-pixel region. This is done to prevent color deviation in the liquid crystal display panel.

RELATED ART DOCUMENT

Patent Document

Patent Document 1: Japanese Patent Application Laid-Open Publication No. 2008-15512

SUMMARY OF THE INVENTION

Problem to be Solved by the Invention

However, in a liquid crystal display panel provided with a TFT substrate, if a conductive foreign objective enters the area between the source electrode and the drain electrode in a TFT of one of the pixels, then a short-circuit will occur between the source electrode and the drain electrode and there is a risk that the pixel will stop operating normally; therefore, when a short-circuit defect is detected between the source electrode and drain electrode of any of the TFTs on the respective pixels in a substrate scanning process, there are many times when the pixel electrode of the pixel where the short-circuit defect has been detected is cut off from the short-circuited drain electrode by a laser and turned into a dark spot in a correcting process, for example.

However, in the above-mentioned correcting process, even if the pixel electrode of the pixel where the short-circuit defect has been detected is cut off from the short-circuited drain electrode, there is still a risk that short-circuiting could occur between the short-circuited or short-circuiting source electrode on the TFT substrate and the common electrode on the opposite substrate via the foreign object that caused the short-circuit between source electrode and the drain electrode, due to vibrations during transport of the liquid crystal display panel, stress exerted on the panel surface, and the like. Furthermore, in the above-mentioned scanning process, even if a short-circuit defect has not been detected, if there is an undetected conductive foreign object between the source electrode and the drain electrode, then there is a risk that this foreign object hidden between the source electrode and the drain electrode could cause a short-circuit between the source electrode on the TFT substrate and the common electrode on the opposite substrate due to vibrations during transport of the liquid crystal display panel, stress exerted on the panel surface, and the like. In a liquid crystal display panel in which TFTs are respectively provided in the vicinity of portions where gate lines and source lines intersect each other, as with the liquid crystal display panel disclosed in Patent Document 1, there is room for improvement due to the risk of the gate wiring lines and source wiring lines respectively connected to the TFTs being damaged during operation of the laser in the correcting process.

The present invention was made in view of these points, and aims at correcting a short-circuit defect between a source electrode of a thin-film transistor on a thin-film transistor substrate and a common electrode of an opposite substrate as much as possible with ease.

Means for Solving the Problems

To achieve the above-mentioned aims, the present invention has first source electrodes that branch towards first sub-pixels after respective source lines in respective pixels continue along respective gate lines, and second source electrodes that branch towards second sub-pixels.

Specifically, a liquid crystal display panel of the present invention includes: a thin-film transistor substrate provided with a pixel having a first sub-pixel and a second sub-pixel that are adjacent to each other, a gate line between the first sub-pixel and the second sub-pixel, a source line along an edge of the pixel that is disposed in a direction intersecting with the gate line, a first thin-film transistor in the first sub-pixel, and a second thin-film transistor in the second sub-pixel, the first thin-film transistor having a first source electrode and the second thin-film transistor having a second source electrode; an opposite substrate facing the thin-film transistor substrate and having a common electrode; and a liquid crystal layer between the thin-film transistor substrate and the opposite substrate, wherein the source line has a lead out part that extends along the gate line and a branched part that branches to the first source electrode and the second source electrode from the lead out part, and wherein the gate line has an opening at the branched part.

With this configuration, the liquid crystal display panel has a lead out part where the source line extends along the gate line and a branched part that branches to the first source electrode and second source electrode from the lead out part, and the gate line has an opening at the branched part of the source line; therefore, in the respective pixels of the liquid crystal display panel, if a short-circuit defect is detected between the first source electrode of the first thin-film transistor or the second source electrode of the second thin-film transistor on the thin-film transistor substrate and the common electrode on the opposite substrate, then in the pixel where the short-circuit defect has been detected, a laser is radiated through the opening on the gate line to cut the short-circuited first source electrode or second source electrode, thereby isolating the corresponding first thin-film transistor or second thin-film transistor from the source line where the thin-film transistor was connected. Due to this, in the pixel where the short-circuit defect has been detected, signals that are inputted to the common electrode will no longer be inputted to the source line; therefore, the short-circuit that occurred between the source electrode of the thin-film transistor on the thin-film transistor substrate and the common electrode on the opposite substrate is corrected. When correcting the short-circuit defect, the spot (the branched part that branches to the first source electrode or second source electrode) irradiated by the laser is isolated from the portion of the respective source lines extending in a direction that intersects the respective gate lines, and does not overlap the gate line; thus, damage to the source line and gate line caused by the laser can be suppressed, and the short-circuit defect is corrected with greater ease than if the thin-film transistor were arranged in the vicinity of where the source line and the gate line intersect, for example. Accordingly, the short-circuit between the source electrode of the thin-film transistor on the thin-film transistor substrate and the common electrode on the opposite substrate can be corrected as much as possible with ease.

A liquid crystal display panel of the present invention includes a thin-film transistor substrate provided with a plurality of pixels that are arranged in a matrix and that each have a first sub-pixel and a second sub-pixel that are adjacent to each other, a plurality of gate lines extending in parallel to each other between the first sub-pixels and the second sub-pixels of the respective pixels, a plurality of source lines extending in parallel with each other between the respective pixels that are disposed in a direction along the respective gate lines, a plurality of first thin-film transistors in the respective first sub-pixels of the respective pixels, and a plurality of second thin-film transistors in the respective second sub-pixels of the respective pixels; an opposite substrate facing the thin-film transistor substrate and having a common electrode; and a liquid crystal layer between the thin-film transistor substrate and the opposite substrate, wherein the thin-film transistor substrate has a first source electrode that forms a part of the first thin-film transistor and a second source electrode that forms a part of the second thin-film transistor in each pixel, the respective source lines continuing along the respective gate lines and then branching to the respective first source electrodes and the respective second source electrodes, and wherein the respective gate lines have openings where the respective source lines have branched.

With this configuration, in the respective pixels, the liquid crystal display panel has first source electrodes that branch towards the first sub-pixels after the respective source lines continue along the respective gate lines, and second source electrodes that branch towards the second sub-pixels, and the respective gate lines have openings where the respective source lines have branched, or namely, at the first source electrodes and the second source electrodes; thus, in the respective pixels of the liquid crystal display panel, if a short-circuit is detected between the first source electrode of the first thin-film transistor or the second source electrode of the second thin-film transistor on the thin-film transistor substrate and the common electrode on the opposite substrate, then in the pixels where the short-circuit defect has been detected, the laser is radiated through the opening on the gate line to cut the short-circuited first source electrode or second source electrode, thereby isolating the corresponding first thin-film transistor or second thin-film transistor from the source line where the thin-film transistor was connected. Due to this, in the pixel where the short-circuit defect has been detected, signals that are inputted to the common electrode will no longer be inputted to the source line; therefore, the short-circuit that occurred between the source electrode of the thin-film transistor on the thin-film transistor substrate and the common electrode on the opposite substrate is corrected. When correcting the short-circuit defect, the spot (the first source electrode or second source electrode) irradiated by the laser is isolated from the portion of the respective source lines extending in a direction that intersects the respective gate lines, and does not overlap the gate line; thus, damage to the respective source lines and respective gate lines caused by the laser can be suppressed, and the short-circuit defect is corrected more easily than if the thin-film transistor were arranged in the vicinity of where the source line and the gate line intersect, for example. Accordingly, the short-circuit between the source electrode of the respective thin-film transistors on the thin-film transistor substrate and the common electrode on the opposite substrate can be corrected as much as possible with ease.

The respective gate lines may have openings at locations to which the respective source lines have continued.

With this configuration, the respective gate lines have openings where the respective source lines have continued; therefore, the area of the respective gate lines overlapping the respective source lines is suppressed, and parasitic capacitance forming at the intersections of the respective gate lines and respective source lines is minimized.

The respective first thin-film transistors may have island-shaped first semiconductor layers, the first source electrodes may have cuttable portions that are formed in a line shape greater than or equal to 3 μm so as to not overlap the respective first semiconductor layers, the second thin-film transistors may have island-shaped second semiconductor layers, and the second source electrodes may have cuttable portions that are formed in a line shape greater than or equal to 3 μm so as to not overlap the respective second semiconductor layers.

With this configuration, the first thin-film transistor has cuttable portions are formed in a line shape greater than or equal to 3 μm such that the first source electrode does not overlap the first semiconductor layer, and the second thin-film transistor has cuttable portions that are formed in a line shape greater than or equal to 3 μm such that the second source electrode does not overlap the second semiconductor layer; therefore, when correcting a short-circuit defect, the short-circuited first source electrode or second source electrode can be reliably cut by the respective cuttable portions being irradiated by the laser.

The respective first thin-film transistors and the respective second thin-film transistors may be in a middle of a pair of the adjacent source lines.

With this configuration, the respective first thin-film transistors and respective second thin-film transistors are provided in the middle of the pair of adjacent source lines; therefore, when correcting a short-circuit defect, the spot (first source electrode or second source electrode) irradiated by the laser is specifically isolated from the portion of the respective source lines extending in a direction that intersects the respective gate lines. Furthermore, the liquid crystal display panel, which uses photoalignment technology that precisely controls the alignment of the liquid crystal molecules at the picometer level, has "+"-shaped dark parts formed at the center of the respective sub-pixels, for example; therefore, these dark parts are used to suppress a decrease in the aperture ratio of the respective pixels caused by arrangement of the auxiliary capacitance by arranging the respective extending sections of the respective first thin-film transistors, respective second thin-film transistors, capacitance lines, and the drain electrodes overlapping the capacitance lines.

A method of manufacturing a liquid crystal display panel according to the present invention includes: making a thin-film transistor substrate, the thin-film transistor substrate being provided with a plurality of pixels arranged in a matrix having first sub-pixels and second sub-pixels that are mutually adjacent to each other, a plurality of gate lines extending in parallel to each other between the first sub-pixels and the second sub-pixels of the respective pixels, a plurality of source lines extending in parallel with each other between the respective pixels that are disposed in a direction along the respective gate lines, a plurality of first thin-film transistors on the respective first sub-pixels of the respective pixels, a plurality of second thin-film transistors in the respective second sub-pixels of the respective pixels, a first source electrode that forms a part of the first thin-film transistor and a second source electrode that forms a part of the second thin-film transistor in each pixel, the respective source lines continuing along the respective gate lines and then branching to the respective first source electrodes and the respective second source electrodes, the respective gate lines having openings where the respective source lines have branched; making an opposite substrate having a common electrode; making a bonded member by bonding the thin-film transistor substrate made in the step of making a thin-film transistor substrate to the opposite substrate made in the step of making an opposite substrate and providing a liquid crystal layer therebetween; detecting a defect when a short-circuit has occurred between the first source electrode or the second source electrode and the common electrode in the respective pixels of the bonded member made in the step of making a bonded member; and correcting a defect by cutting the short-circuited first source electrode or the second source electrode with a laser through the openings on the respective gate lines in the pixels where the short-circuit defect has been detected in the step of detecting a defect, thereby isolating the corresponding first thin-film transistor or second thin-film transistor from the source line to which the thin-film transistor was connected.

With this method, in the respective pixels of the thin-film transistor substrate made in the step of making the thin-film transistor substrate, the liquid crystal display panel has, in the respective pixels, first source electrodes that branch towards the first sub-pixels after the respective source lines continue along the respective gate lines, and second source electrodes that branch towards the second sub-pixels, and the respective gate lines have openings where the respective source lines have branched, or namely, at the first source electrodes and the second source electrodes; thus, in the step of detecting a defect, if a short-circuit is detected between the first source electrode of the first thin-film transistors or the second source electrode of the second thin-film transistors on the thin-film transistor substrate and the common electrode on the opposite substrate in the respective pixels of the bonded member made in the step of making a bonded member, or namely, the liquid crystal display panel, then in the pixels where the short-circuit defect has been detected in the step of detecting a defect, the laser is radiated through the openings on the respective gate lines to cut the short-circuited first source electrode or second source electrode, thereby isolating the corresponding first thin-film transistor or second thin-film transistor from the source line where the thin-film transistor was connected. Due to this, in the pixel where the short-circuit defect has been detected, signals that are inputted to the common electrode will no longer be inputted to the source line; therefore, the short-circuit that occurred between the source electrode of the thin-film transistor on the thin-film transistor substrate and the common electrode on the opposite substrate is corrected. When correcting the short-circuit defect in the step of repairing a defect, the spot (the first source electrode or second source electrode) irradiated by the laser is isolated from the portion of the respective source lines extending in a direction that intersects the respective gate lines, and does not overlap the gate line; thus, damage to the respective source lines and respective gate lines caused by the laser can be suppressed, and the short-circuit defect is corrected more easily than if the thin-film transistor were arranged in the vicinity of where the source line and the gate line intersect, for example. Accordingly, the short-circuit between the source electrode of the respective thin-film transistors on the thin-film transistor substrate and the common electrode on the opposite substrate can be corrected as much as possible with ease.

The thin-film transistor substrate may have, in the respective pixels, first gate electrodes where the respective gate lines form a portion of the respective first thin-film transistors, and second gate electrodes isolated from the first gate electrodes and forming a portion of the respective second thin-film transistors, and in the step of correcting a defect, the first gate electrode or the second gate electrode corresponding to the short-circuited first source electrode or the second source electrode may be isolated from the gate line to which the gate electrode was connected.

With this method, the first gate electrode or second gate electrode corresponding to the short-circuited first source electrode or second source electrode is isolated from the gate line where the gate electrode was connected; therefore, issues caused by the short-circuit defect of the thin-film transistor can be reduced by the electrical connection between the thin-film transistor of the sub-pixel where the short-circuit defect has occurred being severed from the corresponding gate line and source line.

Effects of the Invention

According to the present invention, a liquid crystal display panel has, in respective pixels, first source electrodes that branch towards first sub-pixels after respective source lines continue along respective gate lines, and second source electrodes that branch towards second sub-pixels; therefore, a short-circuit defect that has occurred between the source electrodes of respective thin-film transistors on a thin-film transistor substrate and a common electrode on an opposite substrate can be corrected as much as possible with ease.

DETAILED DESCRIPTION OF EMBODIMENTS

Embodiments of the present invention will be described in detail below with reference to drawings. The present invention is not limited to the embodiments below.

Embodiment 1

Figure 1:
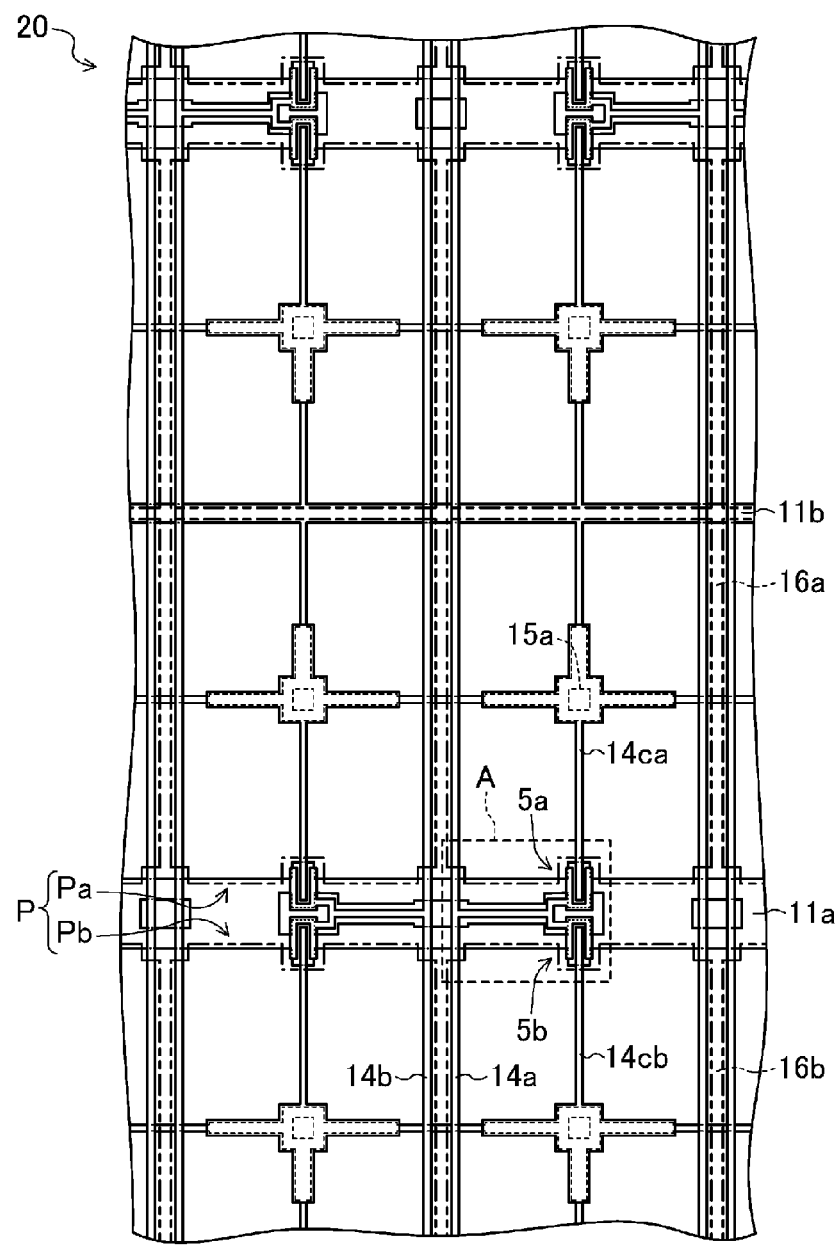
FIG. 1 is a plan view that shows a TFT substrate included in the liquid crystal display panel according to Embodiment 1.
Figure 2:
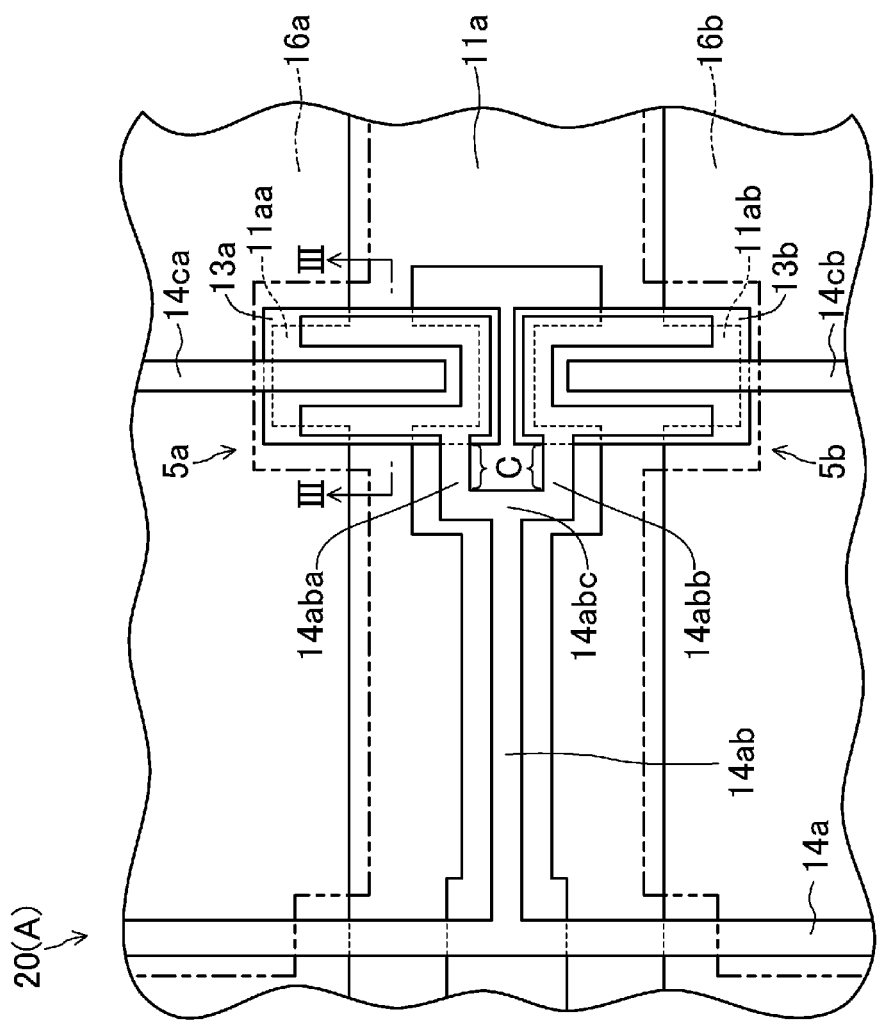
FIG. 2 is a magnified plan view of an area A on the TFT substrate in FIG. 1.
Figure 3:
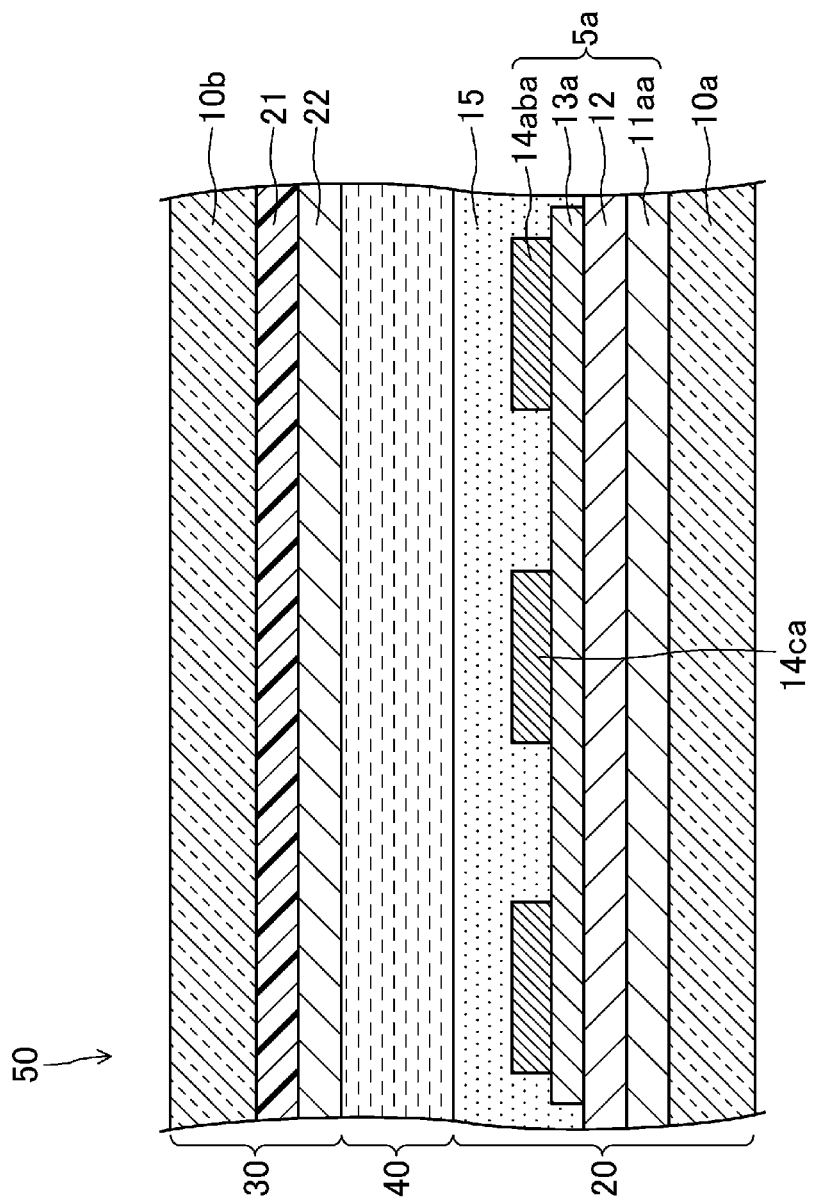
FIG. 3 is a cross-sectional view of the TFT substrate and the liquid crystal display panel provided therewith in FIG. 2 along the line III-III.
Figure 4:
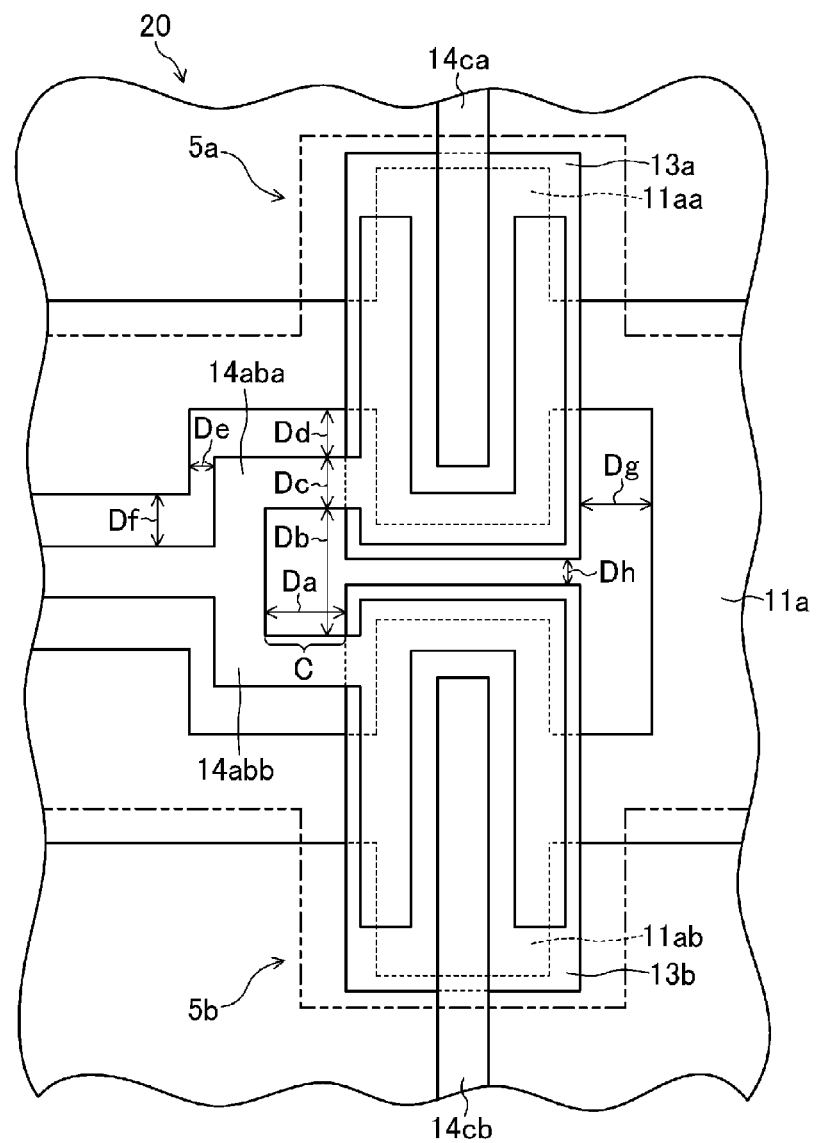
FIG. 4 is a magnified plan view of an area where a TFT is formed on the TFT substrate.

FIGS. 1 to 7 show Embodiment 1 of liquid crystal display panel and a method of manufacturing the same according to the present invention. Specifically, FIG. 1 is a plan view that shows a TFT substrate 20 included in a liquid crystal display panel 50 according to the present embodiment, and FIG. 2 is a magnified plan view of an area A on the TFT substrate 20 in FIG. 1. FIG. 3 is a cross-sectional view of the TFT substrate 20 and the liquid crystal display panel 50 provided therewith in FIG. 2 along the line III-III. FIG. 4 is a magnified plan view of the vicinity of an area where a first TFT 5a and a second TFT 5b are formed on the TFT substrate 20, or namely, an area cut by the laser during correction of a short-circuit defect.

As shown in FIG. 3, the liquid crystal display panel 50 includes the TFT substrate 20 and opposite substrate 30 provided so as to face each other, a liquid crystal layer 40 between the TFT substrate 20 and the opposite substrate 30, and a sealing material (not shown) that adheres the TFT substrate 20 and the opposite substrate 30 together and seals the liquid crystal layer 40 between the TFT substrate 20 and the opposite substrate 30. As shown in FIG. 1, the TFT substrate 20 provided with these has a plurality of pixels P arranged in a matrix, and each pixel has a first sub-pixel Pa and a second sub-pixel Pb arranged in the lengthwise direction of the drawing so as to face each other.

As shown in FIGS. 1 to 3, the TFT substrate 20 includes: a transparent substrate 10a; a plurality of gate wiring lines 11a on the transparent substrate 10a extending in parallel to each other between the first sub-pixels Pa and the second sub-pixels Pb of the respective pixels; a plurality of capacitance lines 11b provided on the transparent substrate 10a so as to extend in parallel with each other between the respective pixels P in the extension direction of the respective gate wiring lines 11a (the horizontal direction in FIG. 1); a plurality of first source lines 14a extending in parallel with each other between the respective pixels P in the direction (lengthwise direction in FIG. 1) perpendicular to the respective gate lines 11a and capacitance lines 11b; a plurality of second source lines 14b extending in parallel with each other between the respective pixels P in the direction perpendicular to the respective gate lines 11a and capacitance lines 11b and being adjacent to the respective first source lines 14a; a plurality of the first TFTs 5a, each provided on the respective first sub-pixels Pa; a plurality of the second TFTs 5b, each provided on the respective second sub-pixels Pb; an interlayer insulating film 15 provided so as to cover the respective first TFTs 5a and second TFTs 5b; a plurality of first pixel electrodes 16a provided on the interlayer insulating film 15 in the respective first sub-pixels Pa and connected to the respective first TFTs 5a; a plurality of second pixel electrodes 16b provided on the interlayer insulating film 15 in the respective second sub-pixels Pb and connected to the respective second TFTs 5b; and an alignment film (not shown) provided so as to cover the respective first pixel electrodes 16 and respective second pixel electrodes 16b.

As shown in FIG. 1, the respective capacitance lines 11b are provided between the pair of adjacent gate wiring lines 11a in a grid pattern with two rows.

As shown in FIGS. 1 to 3, the first TFT 5a includes: a first gate electrode 11aa, which is a part of the gate wiring line 11a, on the transparent substrate 10a; a gate insulating film 12 provided so as to cover the first gate electrode 11aa; a first semiconductor layer 13a provided on the gate insulating film 12 in an island-shape so as to overlap the first gate electrode 11aa; and a first source electrode 14aba and a first drain electrode 14ca provided on the first semiconductor layer 13a so as to overlap the first gate electrode 11aa and that face each other with a gap therebetween.

As shown in FIGS. 1 and 2, the first source electrode 14aba is a part that branches into a "U"-shape towards the first sub-pixel Pa after continuing along the gate line 11a from the first source line 14a or second source line 14b. As shown in FIG. 2, the part continuing along the gate line 11a from the first source line 14a or second source line 14b becomes a lead out part 14ab where the first source line 14a or second source line 14b extends along the gate line 11a.

As shown in FIG. 1, the first drain electrode 14ca extends in a "+"-shape in the center of respective first sub-pixels Pa and this first drain electrode 14ca is connected to the first pixel electrode 16a via a contact hole 15a formed in the interlayer insulating film 15 in the middle of this extended "+"-shaped portion. The first drain electrode 14ca forms an auxiliary capacitance of the respective first sub-pixels Pa by overlapping the capacitance line 11b through the gate insulating film 12.

As shown in FIGS. 1 to 3, the second TFT 5b includes: a second gate electrode 11ab, which is part of the gate line 11a on the transparent substrate 10a; the gate insulating film 12 provided so as to cover the second gate electrode 11ab; a second semiconductor layer 13b provided in an island-shape on the gate insulating film 12 so as to overlap the second gate electrode 11ab; and a second source electrode 14abb and a second drain electrode 14cb that are provided on the second semiconductor layer 13b so as to overlap the second gate electrode 11ab and that face each other with a gap therebetween.

As shown in FIGS. 1 and 2, the second source electrode 14abb is a part that branches into a "U"-shape towards the second sub-pixel Pb after continuing along the gate line 11a from the first source line 14a or second source line 14b. As shown in FIG. 2, the branched part 14abc is located between the first source electrode 14aba and the second source electrode 14abb, the branched part 14abc branching from the lead out part 14ab to the first source electrode 14aba and second source electrode 14abb.

As shown in FIG. 1, the second drain electrode 14cb extends in a "+"-shape in the center of the respective second sub-pixels Pb and this second drain electrode 14cb is connected to the second pixel electrode 16b via the contact hole 15a formed in the interlayer insulating film 15 in the middle of this extended "+"-shaped portion. The second drain electrode 14cb forms an auxiliary capacitance with the respective second sub-pixels Pb by overlapping the capacitance line 11b through the gate insulating film 12.

As shown in FIG. 1, the first TFTs 5a and second TFTs 5b adjacent to each other along the direction (the lengthwise direction of the drawing) perpendicular to the gate line 11a are connected to different source lines (the first source line 14a and second source line 14b). The connecting structure of the first TFT 5*a* and the second TFT 5*b* to the first source line 14*a* and the second source line 14*b* is arranged in an island shape. In other words, as shown in FIG. 1, the first TFT 5*a* and second TFT 5*b* on the lower right side of the drawing are connected to the first source line 14*a* extending through the middle of the drawing, and the first TFT 5*a* and second TFT 5*b* on the upper right side in the drawing adjacent to each other along the lengthwise direction of the drawing are connected to the second source line 14*b* extending through the right side of the drawing. The first TFT 5*a* and second TFT 5*b* on the lower left side in the drawing are connected to the second source line 14*b* extending through the center of the drawing, and the first TFT 5*a* and second TFT 5*b* on the upper left side in the drawing adjacent to each other along the lengthwise direction of the drawing are connected to the first source line 14*a* extending through the left side of the drawing.

As shown in FIGS. 1 and 2, the gate line 11*a* opens at the branched part of the first source line 14*a* and second source line 14*b* (the branched part 14*abc* between the first source electrode 14*aba* and second source electrode 14*abb*) and at the lead out part 14*ab*. As shown in FIGS. 1 and 2, the first gate electrode 11*aa* and second gate electrode 11*ab* have a gap therebetween in the opening in the gate line 11*a*.

As shown in FIG. 2, the first source electrode 14*aba* and second source electrode 14*abb* each have a cuttable portion C formed in a line greater than or equal to 3 µm so as to not respectively overlap the first semiconductor layer 13*a* and second semiconductor layer 13*b*. As shown in FIG. 4, an example of the specific dimensions in the vicinity of the first TFT 5*a* and second TFT 5*b* is: Da is approximately 10 µm, Db is approximately 15 µm, Dc is approximately 6 µm, Dd is approximately 7 µm, De is approximately 4 µm, Df is approximately 7 µm, Dg is approximately 10 µm, and Dh is approximately 4.5 µm. The respective sizes of the first sub-pixels Pa and second sub-pixels Pb are approximately 375 µm×250 µm (L×W).

As shown in FIG. 3, the opposite substrate 30 includes: a transparent substrate 10*b*; a black matrix 21 provided in a frame shape on the transparent substrate 10*b* and in a grid shape within the frame thereof; a plurality of colored layers (not shown) such as a red layer, green layer, and blue layer each provided between the respective grid lines of the black matrix 21; a common electrode 22 provided so as to cover the black matrix 21 and the respective colored layers; a plurality of photo spacers (not shown) provided in column shapes on the common electrode 22; and an alignment film (not shown) provided so as to cover the common electrode and the respective photo spacers.

The liquid crystal layer 40 is constituted of a nematic liquid crystal material having electro-optical properties, or the like, and includes liquid crystal molecules of a negative dielectric constant anisotropy ($\Delta \epsilon < 0$).

The liquid crystal display panel 50 with the above-mentioned configuration applies a prescribed voltage for the respective pixels P to the liquid crystal layer 40 arranged between the respective first pixel electrodes 16*a* and second pixel electrodes 16*b* on the TFT substrate 20, and the common electrode 22 on the opposite substrate 30. This applied voltage causes the orientation state of the liquid crystal layer 40 to change, thereby adjusting the transmittance of light passing through the panel for the respective pixels P and displaying an image. In the liquid crystal display panel 50, by driving the first sub-pixels Pa and the second sub-pixels Pb of the respective pixels P separately, the brightness of the first sub-pixels Pa and the second sub-pixels Pb of the respective pixels P are controlled so as to be different from each other.

Figure 5:
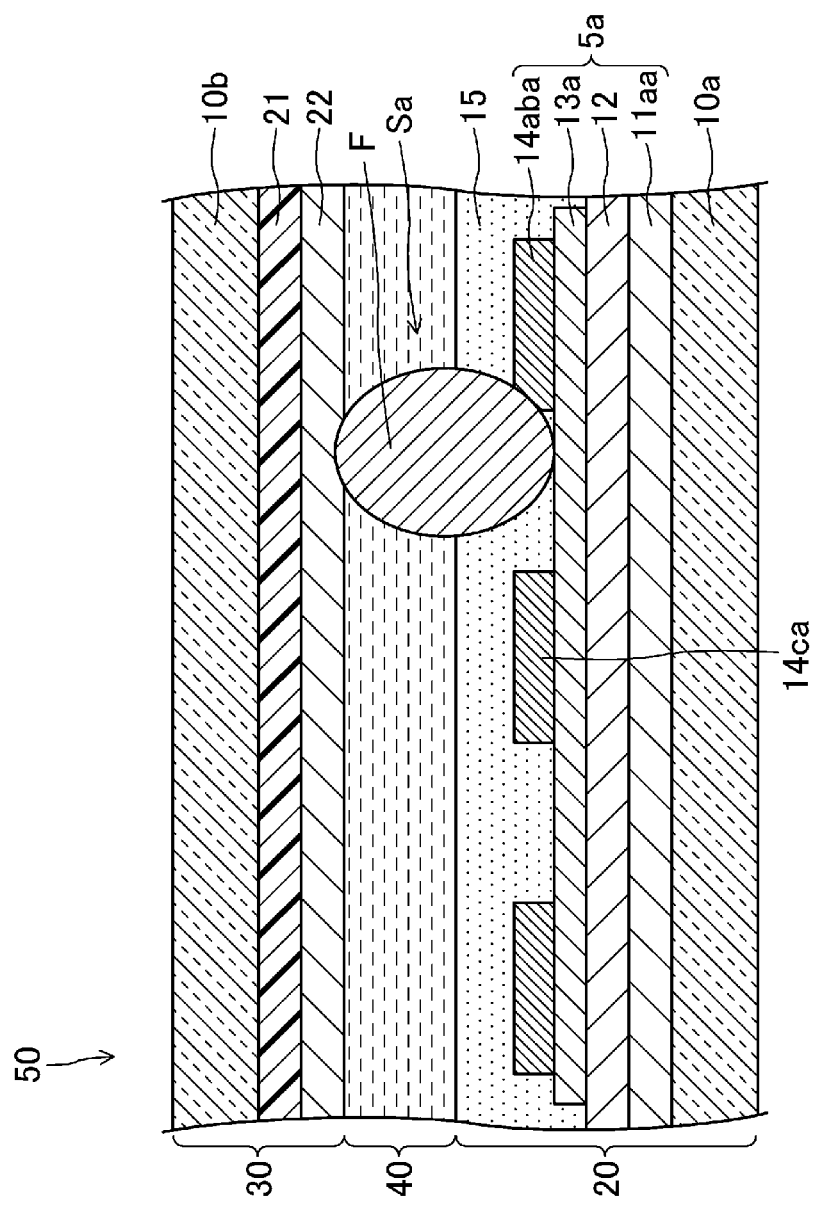
FIG. 5 is a cross-sectional view of the liquid crystal display panel in which a short-circuit defect has occurred between the source electrode and the common electrode.
Figure 6:
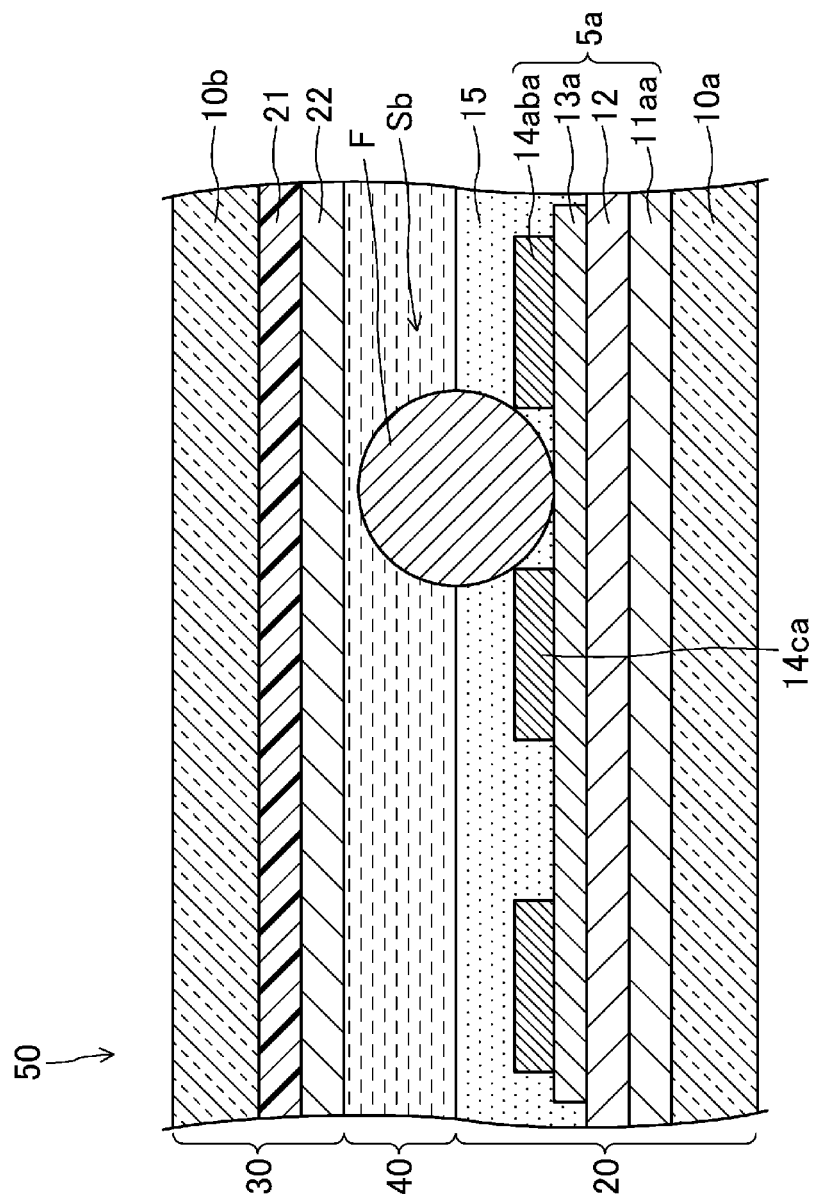
FIG. 6 is a cross-sectional view of the liquid crystal display panel in which a short-circuit defect has occurred between the source electrode and the drain electrode.
Figure 7:
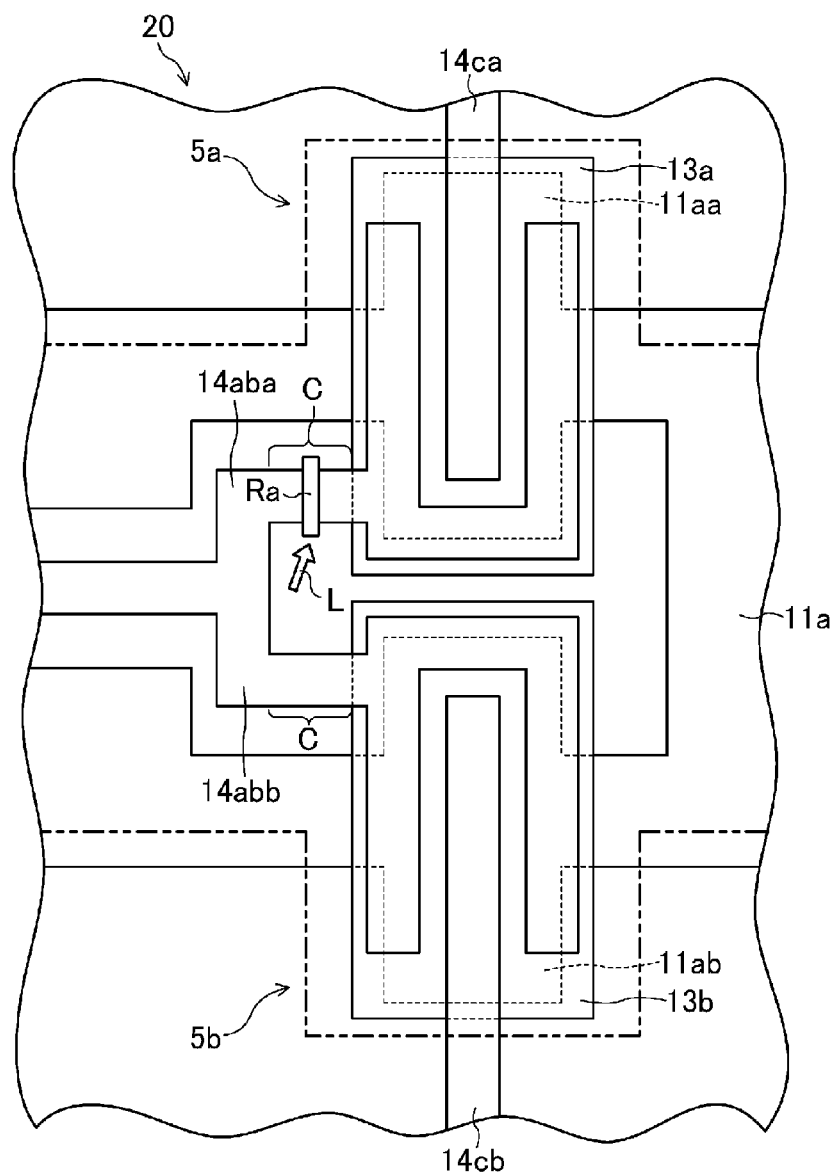
FIG. 7 is a plan view of the TFT substrate showing a method of manufacturing the liquid crystal display panel according to Embodiment 1.

Next, a method to manufacture the liquid crystal display panel 50 of the present embodiment will be explained. FIG. 5 is a cross-sectional view of the liquid crystal display panel 50 when a short-circuit defect Sa has occurred between the first source electrode 14*aba* and the common electrode 22. FIG. 6 is a cross-sectional view of the liquid crystal display panel 50 when a short-circuit defect Sb has occurred between the first source electrode 14*aba* and the first drain electrode 14*ca*. FIG. 7 is a plan view of the TFT substrate 20 showing a method of manufacturing a liquid crystal display panel 50 according to the present embodiment. A method of manufacturing in the present embodiment includes making a TFT substrate, making an opposite substrate, making a bonded member, detecting a defect, and correcting a defect.

<Making TFT Substrate>

First, a titanium film (thickness of approximately 25 nm), a copper film (thickness of approximately 400 nm), and the like are sequentially deposited on the entire substrate of the transparent substrate 10*a*, which is a glass substrate or the like, by sputtering, for example. After the metal multilayer film is formed, photolithography, etching, stripping of the resist pattern, and then cleaning are performed on this metal multilayer film to form the gate lines 11*a*, which have the first gate electrodes 11*aa* and the second gate electrodes 11*ab*, and the capacitance lines 11*b*.

Next, a silicon nitride film (thickness of approximately 400 nm) and the like are deposited on the entire substrate having the gate line 11*a* and capacitance line 11*b* by plasma-enhanced CVD (chemical vapor deposition), for example, in order to form the gate insulating film 12.

Thereafter, an intrinsic amorphous silicon film (thickness of approximately 200 nm) and an n-amorphous silicon film doped with phosphorous (thickness of approximately 20 nm), for example, are sequentially deposited on the entire substrate having the gate insulating film 12 by plasma-enhanced CVD, for example. Then, photolithography, etching, stripping of the resist pattern, and cleaning are performed on the multilayer film constituted of the intrinsic amorphous silicon film and n-amorphous silicon film in order to respectively form an island-shaped first semiconductor layer formation layer (13*a*) and second semiconductor layer formation layer (13*b*) above the first gate electrode 11*aa* and second gate electrode 11*ab*.

Next, a titanium film (thickness of approximately 30 nm), a copper film (thickness of approximately 400 nm), and the like are sequentially deposited by sputtering, for example, on the entire substrate where the first semiconductor layer formation layer (13*a*) and second semiconductor layer formation layer (13*b*) are formed. After the metal multilayer film is formed, photolithography, etching, stripping of the resist pattern, and then cleaning are performed on this metal multilayer film to form the first source line 14*a* having the first source electrode 14*aba* and second source electrode 14*abb*, the second source line 14*b* having the first source electrode 14*aba* and second source electrode 14*abb*, the first drain electrode 14*ca*, and the second drain electrode 14*cb*.

The first semiconductor layer 13*a*, the first TFTs 5*a* provided therewith, the second semiconductor layer 13*b*, and the second TFTs 5*b* provided therewith are formed by etching the n-amorphous silicon layer of the first semiconductor layer formation layer (13*a*) and the second semiconductor layer formation layer (13*b*) with the first source electrode 14*aba*, first drain electrode 14*ca*, second source electrode 14*abb*, and second drain electrode 14*cb* as a mask.

A silicon nitride film (thickness of approximately 200 nm) or the like is deposited by plasma-enhanced CVD, for example, on the entire substrate where the first TFTs 5a and second TFTs 5b are formed in order to form an inorganic insulating film.

Next, an acrylic-based photosensitive resin film is coated by spin coating or slit coating, for example, on the entire substrate where the inorganic insulating film is formed, and this coated inorganic insulating film is exposed, developed, and baked to form an organic insulating film (thickness of approximately 2500 nm) above the first drain electrode 14ca and second drain electrode 14cb. This organic insulating film has an opening that serves as a part of the contact hole 15a.

The portion of the inorganic insulating film exposed by the opening of the organic insulating film is removed by etching, and the interlayer insulating film 15 constituted of the multilayer film of the inorganic interlayer insulating film and organic interlayer insulating film is formed by forming the contact hole 15a.

Then, a transparent electrode film such as an ITO (indium tin oxide) film (thickness of approximately 100 nm) is deposited by sputtering, for example, on the entire substrate where the interlayer insulating film 15 is formed. Thereafter, photolithography, etching, stripping of the resist pattern, and cleaning are performed on this transparent electrode film to form the first pixel electrodes 16a and second pixel electrodes 16b.

Finally, an alignment film material is coated by spin coating or slit coating, for example, on the entire substrate where the first pixel electrodes 16a and second pixel electrodes 16b are formed, and this coated alignment film material is exposed, developed, and baked to form the alignment film (thickness of approximately 100 nm). The alignment film material is constituted of a thin-film of a macromolecular organic compound formed such that the side chains thereof tilt towards UV (ultraviolet) light when this UV light irradiates the thin-film for a certain period of time, for example.

In this manner, the TFT substrate 20 can be made.

<Making Opposite Substrate>

First, a black acrylic-based photosensitive resin is coated by spin coating or slit coating, for example, on the entire substrate of the transparent substrate 10b, which is a glass substrate or the like. This coated photosensitive resin is exposed through a photomask, and thereafter the black matrix 21 (thickness of approximately 2 µm) is formed by development.

Next, a red, green or blue acrylic-based photosensitive resin is coated by spin coating or slit coating, for example, on the substrate where the black matrix 21 is formed, and this coated photosensitive resin is exposed through a photomask. Thereafter, patterning is performed through development to form colored layers of a chosen color (a red layer, for example) with a thickness of approximately 2 µm. Similar processes are repeated for the other two colors, thus forming the colored layers of the other two colors (green layer and blue layer, for example) with a thickness of approximately 2 µm.

Thereafter, an ITO film (thickness of approximately 100 nm) is deposited by sputtering, for example, on the substrate having the respective colored layers in order to form the common electrode 22.

A photosensitive resin film constituted of a photosensitive acrylic resin or the like is coated by spin coating or slit coating, for example, on the entire substrate where the common electrode 22 is formed. Thereafter, this photosensitive resin film is exposed, developed, and baked to form photo spacers (thickness of approximately 1 µm).

Finally, an alignment film material is coated by spin coating or slit coating, for example, on the entire substrate where the photo spacers are formed, and this coated alignment film material is exposed, developed, and baked to form the alignment film (thickness of approximately 100 nm).

In this manner, the opposite substrate 30 can be made.

<Making Bonded Member>

First, a sealing material constituted of a resin combined with UV curing and thermal curing or the like is printed in a frame shape on the surface of the opposite substrate 30 made in the process of making the opposite substrate, for example. Thereafter, liquid crystal material is dripped on the inner side of the sealing member.

Next, the opposite substrate 30 on which the liquid crystal material was dripped, and the TFT substrate 20 made in the process of making the TFT substrate, are bonded together in a depressurized state, and by subjecting the bonded member that is bonded in this manner to atmospheric pressure, the front surface and the rear surface of the bonded member are pressurized.

UV light is irradiated on the sealing member sandwiched between this bonded member, and thereafter the sealing member is cured by heating the bonded member.

Lastly, by dicing the bonded member in which the sealing member has been cured, for example, unnecessary portions are removed.

The liquid crystal display panel 50 (bonded member) can be made in the above-mentioned manner.

<Detecting Defect>

A lighting test is performed on the liquid crystal display panel 50 made in the above-mentioned process of making the bonded member by inputting a prescribed scan signal to the respective gate lines 11a, capacitance lines 11b, first source lines 14a, second source lines 14b, and the common electrode 22. As shown in FIG. 5, this will detect the short-circuit defect Sa between the first source electrode 14aba and common electrode 22 caused by a conductive foreign object F such as residual film, for example. As shown in FIG. 6, it is possible that the short-circuit defect Sa occurs due to the foreign object F that caused the short-circuit defect Sb between the first source electrode 14aba and the first drain electrode 14ca moving due to vibrations during transport of the liquid crystal display panel, stress exerted on the panel surface, or the like, for example.

<Correcting Defect>

As shown in FIG. 7, when the short-circuit defect Sa has been detected in the above-mentioned process of detecting the defect, the first source electrode 14aba is cut at the cuttable portion C by irradiating an Ra part of the first source electrode 14aba with a laser L in the first sub-pixel Pa where the short-circuit defect Sa has been detected. This isolates the first TFT 5a from the first source line 14a. The laser L is a YAG (yttrium aluminum garnet) laser or the like and has a spot size of approximately 1 µm×5 µm, for example. Thereafter, the first sub-pixel Pa is turned into a dark spot by connecting the capacitance line 11b to the first drain electrode 14ca by irradiating with the laser this first sub-pixel Pa where the first TFT 5a has been isolated.

The liquid crystal display panel 50 of the present embodiment with the corrected short-circuit defect Sa can be manufactured in this above-mentioned manner.

As described above, according to the liquid crystal display panel 50 of the present embodiment and the method of manufacturing the same, the TFT substrate 20 made in the process of making the TFT substrate includes in the respective pixels P: the first source electrodes 14aba branching towards the first sub-pixels Pa after the respective first source lines 14a or respective second source lines 14b continue from the respective gate lines 11a; and the second source electrodes 14abb branching towards the second sub-pixels Pb. There are openings in the respective gate lines 11a where the respective first source lines 14a or respective second source lines 14b have branched, or namely, where the first source electrode 14aba and second source electrode 14bb are located. Therefore, in the process of detecting the defect, when the short-circuit defect S a has been detected between the first source electrode 14aba of the first TFT 5a or the second source electrode 14abb of the second TFT 5b on the TFT substrate 20 and the common electrode 22 of the opposite substrate 30 in the respective pixels P of the bonded member made in the process of making the bonded member, or namely, the liquid crystal display panel 50, then in the process of correcting the defect the first source electrode 14aba or second source electrode 14abb that has short-circuited is cut by irradiating one of these with the laser L through the openings on the respective gate lines 11a in the pixel P where the short-circuit defect Sa has been detected. This isolates the corresponding first TFT 5a or second TFT 5b from the first source line 14a or second source line 14b where this TFT was connected. In this manner, signals inputted to the common electrode 22 are no longer inputted to the first source line 14a or second source line 14b in the pixel P where the short-circuit defect Sa has been detected; thus, the short-circuit defect Sa that has occurred between the source electrode (first source electrode 14aba and second source electrode 14abb) of the respective TFTs (first TFTs 5 and second TFT 5b) on the TFT substrate 20 and the common electrode 22 on the opposite substrate 30 can be corrected. In the process of correcting the defect, the spot (first source electrode 14aba or second source electrode 14abb) where the laser L is radiated when correcting the short-circuit defect Sa is isolated from the portion of the respective first source lines 14a or respective second source lines 14b extending in the direction perpendicular to the respective gate lines 11a and does not overlap with the gate line 11a; therefore, damage to the respective first source lines 14a or respective second source lines 14b and the respective gate lines 11a due to the laser L can be suppressed, and short-circuit defects can be more easily corrected as compared to if the TFT were arranged in the vicinity of where the source line and gate line intersect, for example. Accordingly, the short-circuit defect Sa that has occurred between the source electrodes (first source electrode 14aba and second source electrode 14abb) of the respective TFTs (first TFT 5a and second TFT 5b) on the TFT substrate 20 and the common electrode 22 on the opposite substrate 30 can be corrected as much as possible with ease.

According to the liquid crystal display panel 50 of the present embodiment, the gate lines 11a are open in portions where the respective first source lines 14a or respective second source lines 14b are extended; thus, the area of the respective gate lines 11a overlapping the respective first source lines 14a and respective second source lines 14b can be suppressed and parasitic capacitance formed on the intersection portions of the respective gate lines 11a with the respective first source lines 14a and respective second source lines 14b can be minimized.

According to the liquid crystal display panel 50 of the present embodiment, the liquid crystal display panel 50 has the cuttable portion C formed in a line shape greater than or equal to 3 µm such that the first source electrode 14aba does not overlap the first semiconductor layer 13a, and has the cuttable portion C formed in a line shape greater than or equal to 3 µm such that the second source electrode 14abb does not overlap the second semiconductor layer 13b; therefore, when correcting the short-circuit defect Sa, the short-circuited first source electrode 14aba or second source electrode 14abb can be reliably cut by irradiating the respective cuttable portions C with the laser L.

According to the liquid crystal display panel 50 of the present embodiment, the respective first TFTs 5a and respective second TFTs 5b are provided in the center of the first source lines 14a and second source lines 14b adjacent to each other across the pixels P; therefore, when correcting the short-circuit defect Sa, the spot (first source electrode 14aba or second source electrode 14abb) where the laser L is radiated can be specifically isolated from the portion of the respective first source lines 14a or respective second source lines 14b extending in a direction perpendicular to the respective gate lines 11a. The liquid crystal display panel 50, which uses photoalignment technology that precisely controls the alignment of the liquid crystal molecules at the picometer level, has "+"-shaped dark parts formed at the center of the respective first sub-pixels Pa and respective second sub-pixels Pb; therefore, these dark parts can be used to suppress a decrease in the aperture ratio of the respective pixels P caused by arrangement of the auxiliary capacitance by arranging the respective extending sections of the respective first TFTs 5a, respective second TFTs 5b, capacitance line 11b, and the first drain electrode 14ca and second drain electrode 14cb overlapping the capacitance line 11b.

Furthermore, according to the liquid crystal display panel 50 of the present embodiment, in the pixel P where the short-circuit defect Sa has been corrected, the first sub-pixel Pa is turned into a dark spot, but the second sub-pixel Pb functions normally; therefore, display quality can be improved more than if the entire pixel P were turned into a dark spot.

Embodiment 2

Figure 8:
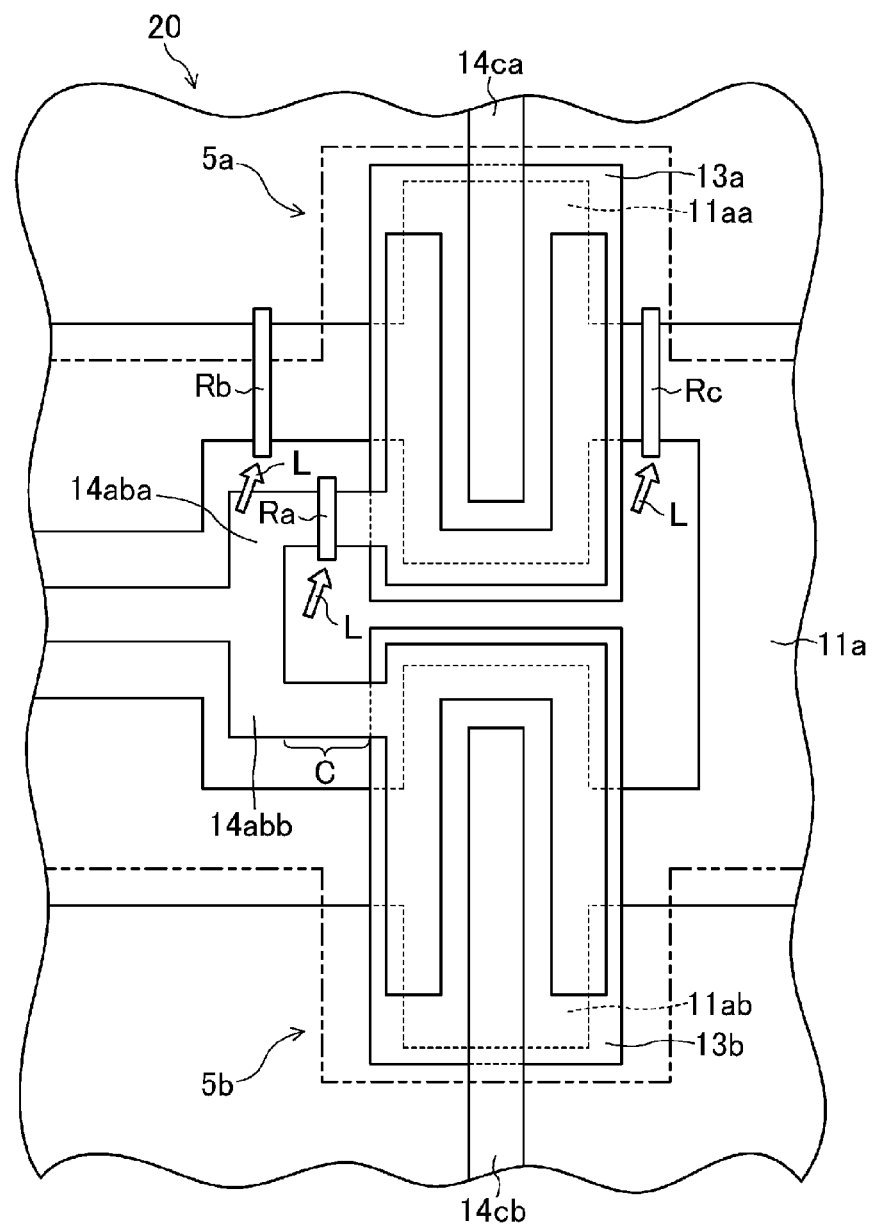
FIG. 8 is a plan view of a TFT substrate showing a method of manufacturing a liquid crystal display panel according to Embodiment 2.

FIG. 8 is a plan view of a TFT substrate 20a showing a method of manufacturing a liquid crystal display panel 50 according to the present embodiment. In the embodiment below, the same members as those in FIGS. 1 to 7 are given the same reference characters, and the descriptions thereof are not repeated.

In Embodiment 1 described above, an example of a method of manufacturing the liquid crystal display panel 50 was shown in which the cutting laser L irradiated one spot on the pixel P where the short-circuit defect Sa was detected, but in the present embodiment, an example of a method of manufacturing the liquid crystal display panel 50 is shown in which three spots on a pixel P where a short-circuit defect Sa has been detected are irradiated with a cutting laser L.

Specifically, in the process of correcting a defect, as shown in FIG. 8, when the short-circuit defect Sa is detected in the process of detecting the defect, an Ra part of a first source electrode 14aba, and an Rb part and Rc part of a gate line 11a are each irradiated with the laser L in a first sub-pixel Pa where the short-circuit defect Sa has been detected. This isolates a first TFT 5a from a first source line 14a and the gate line 11a by cutting the first source electrode 14aba at a cuttable portion C and cutting the gate line 11a in front of and behind a first gate electrode 11aa. Thereafter, the first sub-pixel Pa is turned into a dark spot by connecting a capacitance line 11b to a first drain electrode 14ca by irradiating with the laser this first sub-pixel Pa where the first TFT 5a has been isolated. The liquid crystal display panel 50 of the present embodiment with the corrected short-circuit defect Sa can be manufactured in this above-mentioned manner.

As described above, according to the liquid crystal display panel 50 of the present embodiment and the method of manufacturing the same, the TFT substrate 20a made in the process of making the TFT substrate includes, in the respective pixels P: the first source electrodes 14*aba* branching towards the first sub-pixels Pa after the respective first source lines 14*a* or respective second source lines 14*b* continue from the respective gate lines 11*a*; and the second source electrode 14*abb* branching towards second sub-pixels Pb. There are openings in the respective gate lines 11*a* where the respective first source lines 14*a* or respective second source lines 14*b* have branched, or namely, where the first source electrode 14*aba* and second source electrode 14*abb* are located. Therefore, the short-circuit defect Sa that has occurred between the source electrodes (first source electrode 14*aba* and second source electrode 14*abb*) of the respective TFTs (first TFT 5*a* and second TFT 5*b*) on the TFT substrate 20 and the common electrode 22 on the opposite substrate 30 can be corrected as much as possible with ease.

Furthermore, according to the method of manufacturing the liquid crystal display panel 50 of the present embodiment, in the process of correcting the defect, the first gate electrode 11*aa* corresponding to the short-circuited first source electrode 14*ab* is isolated from the gate line 11*a* where this first gate electrode 11*aa* is connected; therefore, issues caused by the short-circuit defect Sa of the first TFT 5*a* can be reduced by severing the electrical connection between the first TFT 5*a* of the first sub-pixel Pa where the short-circuit defect Sa occurred and the corresponding gate line 11*a* and first source line 14*a*.

In the respective embodiments above, the liquid crystal display panel having TFTs was shown as an example, but the present invention can also be applied to a liquid crystal display panel having three terminal switching elements other than TFTs.

In the respective embodiments above, a method of manufacturing was shown as an example in which the short-circuit defect was corrected after the lighting test, but the present invention can also be applied to a method of manufacturing in which an array scan is performed using a charge detection method or the like on the TFT substrate made in the process of making the TFT substrate in order to detect a short-circuit defect that has occurred between the source electrode and the drain electrode of the TFT, and thereafter this short-circuit defect can be corrected to suppress the occurrence of short-circuit defects between the source electrodes of the respective panelized TFTs in question and the common electrode of the opposite substrate.

In the respective embodiments above, a liquid crystal display panel having bottom gate TFTs was shown as an example, but the present invention can also be applied to a liquid crystal display panel having top gate TFTs.

In the respective embodiments above, a liquid crystal display panel having a TFT substrate provided with two source lines, a first source line and a second source line, between the respective pixels was shown as an example, but the present invention can also be applied to a liquid crystal display panel having a TFT substrate where one source line is provided between the respective pixels.

In the respective embodiments above, a liquid crystal display panel having a TFT substrate in which the electrode of the TFT connected to the pixel electrode is the drain electrode was shown as an example, but the present invention can also be applied to a liquid crystal display panel having a TFT substrate in which the electrode of the TFT connected to the pixel electrode is the source electrode.

INDUSTRIAL APPLICABILITY

As described above, the present invention can correct a short-circuit defect that has occurred between the source electrodes of the respective TFTs on the TFT substrate and the common electrode on the opposite substrate with ease; thus, the present invention is useful for liquid crystal televisions having a liquid crystal display panel and the like.

DESCRIPTION OF REFERENCE CHARACTERS

C cuttable portion
L laser
P pixel
Pa first sub-pixel
Pb second sub-pixel
Sa short-circuit defect
5*a* first TFT
5*b* second TFT
11*a* gate line
11*aa* first gate electrode
11*ab* second gate electrode
13*a* first semiconductor layer
13*b* second semiconductor layer
14*a* first source line
14*ab* lead out part
14*b* second source line
14*aba* first source electrode
14*abb* second source electrode
14*abc* branched part
20 TFT substrate
22 common electrode
30 opposite substrate
40 liquid crystal layer
50 liquid crystal display panel (bonded member)

The invention claimed is:

1. A liquid crystal display panel, comprising:
a thin-film transistor substrate provided with a pixel having a first sub-pixel and a second sub-pixel that are adjacent to each other, a gate line between the first sub-pixel and the second sub-pixel, a source line along an edge of the pixel that is disposed in a direction intersecting with the gate line, a first thin-film transistor in the first sub-pixel, and a second thin-film transistor in the second sub-pixel, the first thin-film transistor having a first source electrode and the second thin-film transistor having a second source electrode;
an opposite substrate facing the thin-film transistor substrate and having a common electrode; and
a liquid crystal layer between the thin-film transistor substrate and the opposite substrate,
wherein the source line has a lead out part that extends along the gate line and a branched part at the end of the lead out part that branches to the first source electrode and the second source electrode directly from the lead out part so that the first source electrode and the second source electrode are connected to the lead out part in parallel, and
wherein the gate line has an opening at the branched part.

2. A liquid crystal display panel, comprising:
a thin-film transistor substrate provided with a plurality of pixels that are arranged in a matrix and that each have a first sub-pixel and a second sub-pixel that are adjacent to each other, a plurality of gate lines extending in parallel to each other between the first sub-pixels and the second sub-pixels of the respective pixels, a plurality of source lines extending in parallel with each other between the respective pixels that are disposed in a direction along the respective gate lines, a plurality of first thin-film transistors in the respective first sub-pixels of the respective pixels, and a plurality of second thin-film transistors in the respective second sub-pixels of the respective pixels;

an opposite substrate facing the thin-film transistor substrate and having a common electrode; and a liquid crystal layer between the thin-film transistor substrate and the opposite substrate, wherein the thin-film transistor substrate has a first source electrode that forms a part of the first thin-film transistor and a second source electrode that forms a part of the second thin-film transistor in each pixel, the respective source lines continuing along the respective gate lines and then branching directly to the respective first source electrodes and the respective second source electrodes so that the first source electrode and the second source electrode in each pixel are connected to the corresponding source line in parallel, and wherein the respective gate lines have openings where the respective source lines have branched.

3. The liquid crystal display panel according to claim 2, wherein the respective gate lines have openings at locations to which the respective source lines have continued.

4. The liquid crystal display panel according to claim 2,
wherein the respective first thin-film transistors have island-shaped first semiconductor layers,
wherein the first source electrodes have cuttable portions that are formed in a line shape greater than or equal to 3 µm so as to not overlap the respective first semiconductor layers,
wherein the second thin-film transistors have island-shaped second semiconductor layers, and
wherein the second source electrodes have cuttable portions that are formed in a line shape greater than or equal to 3 µm so as to not overlap the respective second semiconductor layers.

5. The liquid crystal display panel according to claim 2, wherein the respective first thin-film transistors and the respective second thin-film transistors are in a middle of a pair of the adjacent source lines.

* * * * *